US006498472B1

(12) United States Patent
Lee et al.

(10) Patent No.: US 6,498,472 B1
(45) Date of Patent: Dec. 24, 2002

(54) METHOD FOR HANDLING A MODULE IC AND A CARRIER OF A MODULE IC HANDLER

(75) Inventors: Sang Soo Lee, Choongchungnam-do (KR); Wan Gu Lee, Choongchungnam-do (KR); Jong Won Kim, Kyungki-do (KR); Hee Soo Kim, Kyungki-do (KR); Young Hak Oh, Kyungki-do (KR); Dong Chun Lee, Seoul (KR)

(73) Assignee: Mirae Corporation, Chunan-Si (KR)

( * ) Notice: Subject to any disclaimer, the term of this patent is extended or adjusted under 35 U.S.C. 154(b) by 0 days.

(21) Appl. No.: 09/449,636

(22) Filed: Nov. 30, 1999

(30) Foreign Application Priority Data

Nov. 30, 1998 (KR) ............................................. 98-51989

(51) Int. Cl.[7] .......................... G01R 31/02; B65H 11/00
(52) U.S. Cl. ..................................... 324/158.1; 324/758
(58) Field of Search ................................ 414/403, 416, 414/421, 806, 223.01, 225.01, 798.1, 416.01, 416.09, 222.01, 226.01, 226.02, 226.03, 226.04, 226.08; 324/758, 765, 158.1, 755, 537

(56) References Cited

U.S. PATENT DOCUMENTS 6,019,564 A  *  2/2000  Kiyokawa et al. .......... 414/223
6,062,799 A  *  5/2000  Han et al. .................... 414/416
6,198,273 B1  *  3/2001  Onishi et al. ............. 324/158.1

* cited by examiner

Primary Examiner—Michael Sherry
Assistant Examiner—Paresh Patel
(74) Attorney, Agent, or Firm—Fleshner & Kim, LLP

(57) ABSTRACT

There is disclosed a method for handling a module IC and a carrier of a module IC handler used for transferring the carrier containing a plurality of module ICs between the processes. While a separate carrier containing the produced module ICs is transferred between the processes, the tests for the module ICs are performed. Thus, the reliability of the product discharged can be further improved, and the operation rate of a high-cost test apparatus is maximized. For this, a plurality of module ICs 1 vertically loaded in the carrier are transferred inside a heating chamber 22, the tests for the module ICs 1 are conducted at a test site 7 under the state that the module ICs 1 are contained in the carrier 18, and then at an unloading position 20, the module ICs having been tested are held by pick-up means 8 in an unloading side and classified based upon the test results and the classified module ICs are placed in customer trays 9.

17 Claims, 8 Drawing Sheets

METHOD FOR HANDLING A MODULE IC AND A CARRIER OF A MODULE IC HANDLER

BACKGROUND OF THE INVENTION

1. Field of the Invention

The present invention relates to a module IC handler used to handle the module IC as a final product in testing the performance thereof, and more particularly to a method for handling a module IC and a carrier of the module IC handler that tests the same while the carrier containing a plurality of module ICs is transferred between the processes.

2. Description of the Conventional Art

Typically, a module IC 1 refers to, as shown in FIG. 1, a structure provided with a substrate whose one side or both sides is used for fixedly mounting a plurality of ICs and electric components, for example, by soldering, and has a function for extending a capacity when it is coupled to a mother substrate.

Such a module IC provides higher added-value when sold, as compared with individual sale of each IC as a final product. To this end, the IC manufactures tend to develop it as a main product and sell it.

However, the module IC as a product available from the market is relatively expensive and thus entails higher reliability as an important factor therefor. This requires stringent quality test for passing only products determined to be good, and otherwise, discarding all the module ICs determined to be not good.

In the prior art, there has been no apparatus for automatically loading the module ICs as final products into a test socket, testing the same, classifying into respective categories depending upon the test results and then unloading the classified modules into the customer trays (not shown).

To test the final product of the module IC, the operator manually has to pick up one piece of the module IC from the test tray in which the module ICs are contained therein, load it into a test socket, conducts the tests for a time period preset, and finally classify the module IC depending upon the test result in order to put it into the customer tray. This results in lower work efficiency due to manual work.

Further, such tedious repeated manual work contributes to lower productivity.

To solve such a problem, the inventors developed an automatic module IC handler adapted to test the module ICs, which was disclosed in Korean patent and utility model applications.

FIG. 2 is a schematic plan view of a conventional module IC handler. Referring to FIG. 2, a method for handling the module ICs 1 contained in a loading side tray 3 will be described below.

A pick-up means 6 in the loading side can be moved along X and Y axes 4, 5, respectively. Such a pick-up means 6 is transferred toward the tray 3 located in the loading side and then lowered to hold a plurality of module ICs 1 from the tray 3.

After the pick-up means 6 holds the module ICs 1 from the tray 3, the steps of elevating, transferring along the X and Y axes 4, 5, respectively, and then lowering of the pick-up means 3 are sequentially made, so that the plurality of module ICs can be placed on an upper side of a test socket provided at a test site 7.

The plurality of module ICs 1 are placed on the test socket by such an operation. This operation is repeatedly performed several times to place respective module ICs 1 on all the test sockets located at the test site 7.

When the plurality of module ICs 1 are placed on the test sockets, all of the module ICs are simultaneously downward pressed so that patterns 1a formed at both sides of the module IC are contact with terminals of the test socket. Thereby, the performance tests for the module ICs are conducted using a tester (not shown) during a time period preset of the tester. The test results are reported to a central processing unit (CPU).

After the performance tests for the module ICs 1 are completed, a separate pusher removes the module ICs from the test socket, and an unloading side pick-up means 8 provided on the Y axis 5 holds the plurality of module ICs 1 from the test socket and classifies the module ICs based upon the test results.

The following describes the details of the foregoing, referring to the korean patent application No. 98-1519 filed by the present applicant, relating to a module IC hander for handling the module IC.

As shown in FIGS. 2 to 4, when the loading side pick-up means 6 is transferred towards the tray 3 to hold a plurality of module ICs 1 contained in the tray 3, a finger 10 for holding both ends of the module IC remains maximally opened.

Under such a condition, the maximally opened finger 10 of the pick-up means 6 is moved to the tray 3 along the X and Y axes 4, 5, respectively, until the finger 10 becomes positioned at a position on the module IC1. Thereafter, the finger 10 descends, and then is closed by a cylinder 11. By such an operation, the loading side pick-up means 6 can hold the module IC 1 from the tray 3.

After the loading side pick-up means 6 holds the module IC 1 from the tray 3, the loading side pick-up means 6 is moved to where the test socket 12 is located for testing, as shown in FIG. 3. The pick-up means 6 is lowered and then the finger 10 holding the module IC is opened again, and the module IC is placed on the test socket 12.

After a plurality of module ICs 1 are placed on the test socket 12 by the loading side pick-up means 6, the loading side pick-up means 6 is transferred to the tray 3 side to hold a new module IC 1 to be handled.

Such an operation is repeated. With the repeated operations, all the module ICs 1 to be tested can be loaded into the test socket. Then, with the sequential driving of the cylinder 13 and a poking cylinder 14 being made, the pusher 15 descends as shown in FIG. 4, during which a top surface of the module IC 1 placed on the tests socket 12 is pressed. This makes it possible an electrical connection between the pattern 1a of the module IC 1 and the terminals of the test socket 12, by which the desired performance tests for the module IC become possible.

In the meantime, after the tests for the module IC 1 are completed, the module IC 1 inserted into the test socket 12 is pulled out by rotating a discharging lever 17 using a discharging cylinder 16. Thereafter, another pick-up means 8 positioned at the unloading side is transferred to the test site along the X and Y axes 4, 5, respectively, to hold the module IC 1 after testing and to unload the module IC classified by the test results into a customer tray 9.

However, since the conventional handler directly transfers the module IC 1 held by the loading side pick-up means 6 towards the test socket 12 provided at the test site 7, the following problems occur.

Firstly, since the pick-up means 6, 8 designed to hold the module IC and load/unload it into/from the test socket cannot be used to handle the module IC in a sealed chamber, there is a problem in that the module IC has to be tested at a normal temperature.

Therefore, the module IC 1 determined to be good and discharged is the module IC tested only at a normal temperature. Because the module IC is actually driven at a higher temperature in using such a module IC mounted on the appliances, there occurs a difference between both conditions at the test and at an actual use of the IC, thus resulting in lower reliability of the product discharged.

Secondly, since the module ICs 1 in the tray and in the test socket 12 are held and transferred by the pick-up means 6, 8, the transfer of the module IC cannot be made during the tests. Therefore, an elongated cycle time is introduced, by which lots of module ICs cannot be tested during a given time interval.

Finally, since the module IC 1 is directly handled by the pick-up means, this permits only a horizontal installation of the test socket in the test site. In case another type of the module IC is to be tested, an inconvenience exchanging work of the socket assembly is caused.

SUMMARY OF THE INVENTION

Therefore, it is an object of the present invention to provide a module IC handling apparatus and method therefore by which the module IC accommodated in a carrier is transferred between the test processes for the purpose of further improving the reliability of the product discharged and of maximizing the operation rate of a high-cost apparatus.

Theses objects are accomplished by the present invention providing a method for handling module ICs of a module IC handler, characterized in that while a plurality of module ICs are vertically loaded in a carrier and the carrier containing the module ICs is transferred between the processes, the module ICs are tested at a test site with the module ICs being contained in the carrier, and then, at an unloading position, the module ICs tested are held by pick-up means in an unloading side and classified based upon the test results and the classified module ICs are placed in customer trays.

According to another aspect of the present invention, there is provided a method for handling module ICs of a module IC handler, the method comprising the steps of: holding the module ICs from a tray using a loading side pick-up means and loading the module ICs into a carrier which is horizontally placed and positioned at a loading position; horizontally transferring the carrier containing the module ICs towards a loading side rotator to lock the same to the loading side rotator; opening a shutter of the heating chamber, standing the carrier upright and then lowering the upright carrier, and thereafter releasing the locked state of the carrier; heating the module ICs at a temperature suitable for the test conditions, while the carrier is within the heating chamber; opening the shutter located between the heating chamber and the test site, and horizontally moving the carrier in the heating chamber to the test site; pushing the carrier arrived at the test site in a direction perpendicular to the traveling direction of the carrier to contact patterns of the module IC to terminals of the test socket, and then performing the tests for a preset time period; opening the shutter located between the heating chamber and the test site, horizontally moving the carrier away from the test site and locking the carrier to an unloading side rotator; horizontally returning the unloading side rotator; discharging the carrier from the unloading side rotator to transfer the carrier to the unloading position; holding the module ICs from the carrier which is horizontally placed and positioned at the unloading position, and unloading the module ICs held onto customer trays based upon the test results; and horizontally transferring the carrier from which the module ICs are completely unloaded, to the loading position.

DETAILED DESCRIPTION OF THE INVENTION

Referring to FIGS. 5 to 8, a preferred embodiment of the present invention will be described in detail.

Figure 1:
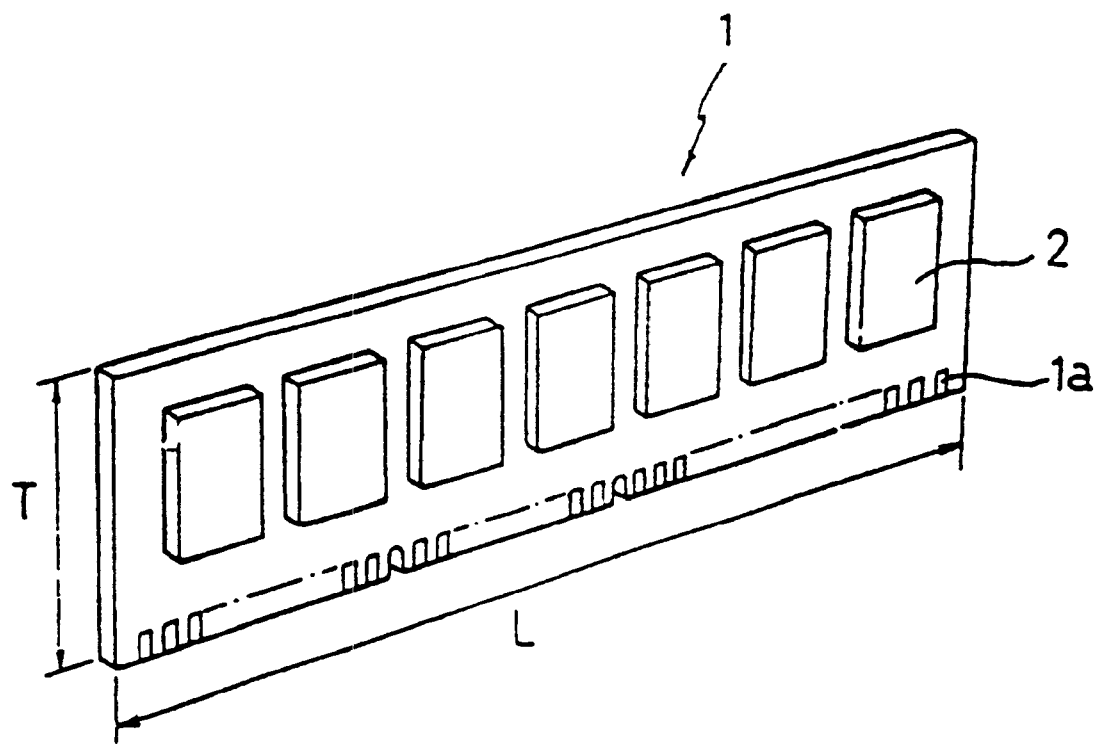
FIG. 1 is a perspective view of a typical module IC.
Figure 2:
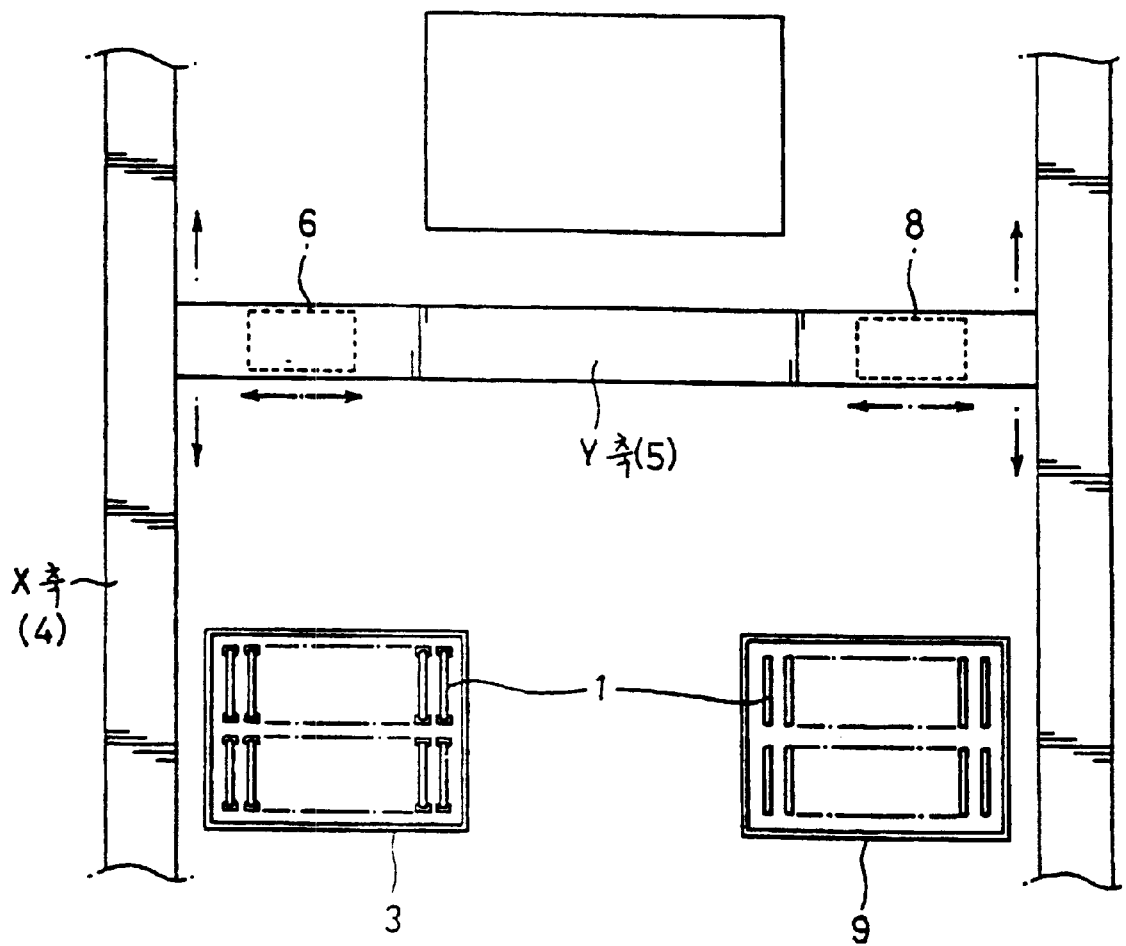
FIG. 2 is a schematic plan view of a conventional module IC handler.
Figure 3:
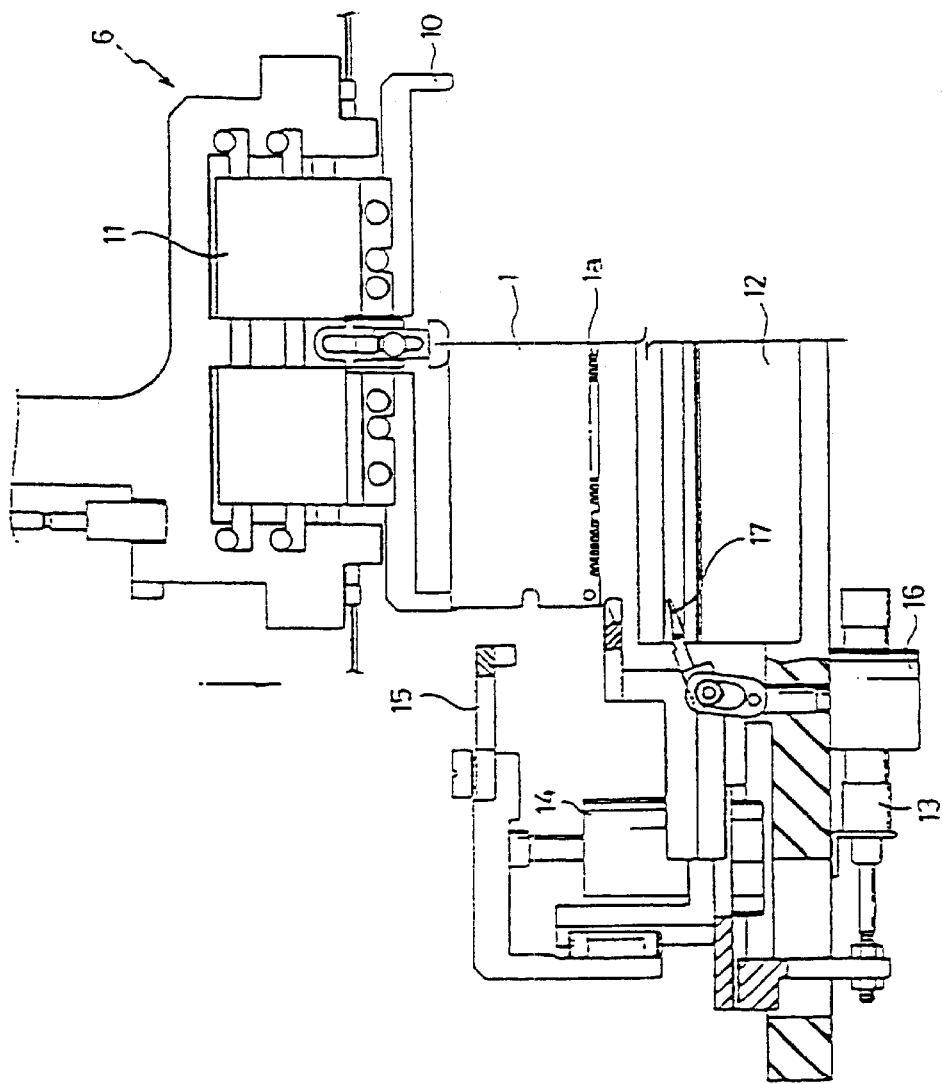
FIG. 3 shows a state that a loading side pick-up means holds the module IC to load the same into a test socket of a test site.
Figure 4:
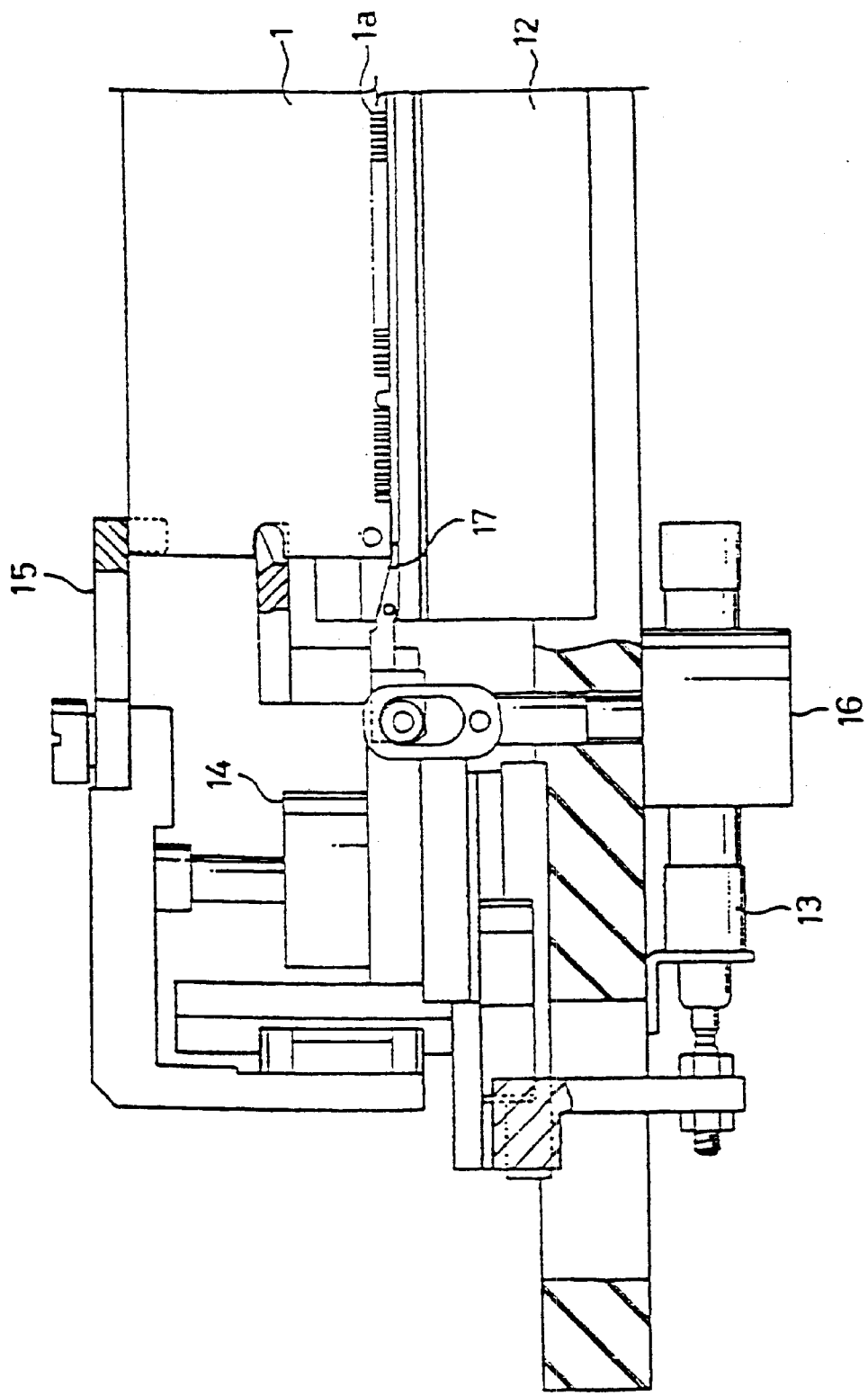
FIG. 4 shows a state that the module IC placed on the test socket has been inserted.
Figure 5:
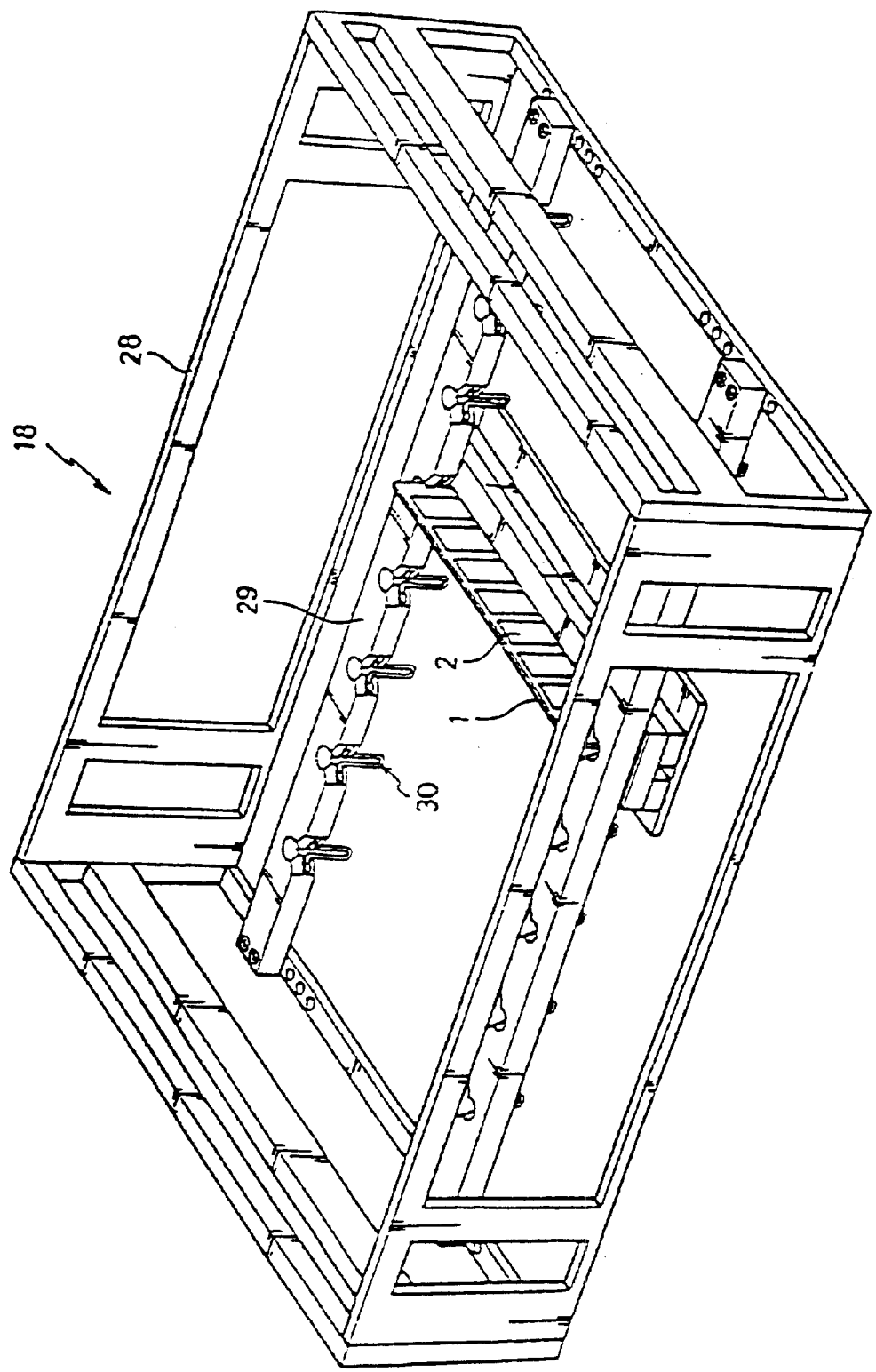
FIG. 5 shows a carrier to which the present invention is applied.

FIG. 5 shows a carrier 18, to which the present invention is applied, used to hold a plurality of module ICs 1 and to transfer the same between the processes. There is provided a housing 28 forming a receiving body for the loading and unloading of the module IC and having an upper side thereof opened and a lower side thereof opened for providing a possible insertion into the test socket. The module ICs 1 are transferred between the processes, with the module ICs 1 being supported by the supporting members 30, wherein the supporting members 30 are arranged with a constant interval therebetween on two parallel supporting elements 29 and face the opposing ones. The parallel supporting elements 29 are fixedly provided in the housing 28.

Figure 6:
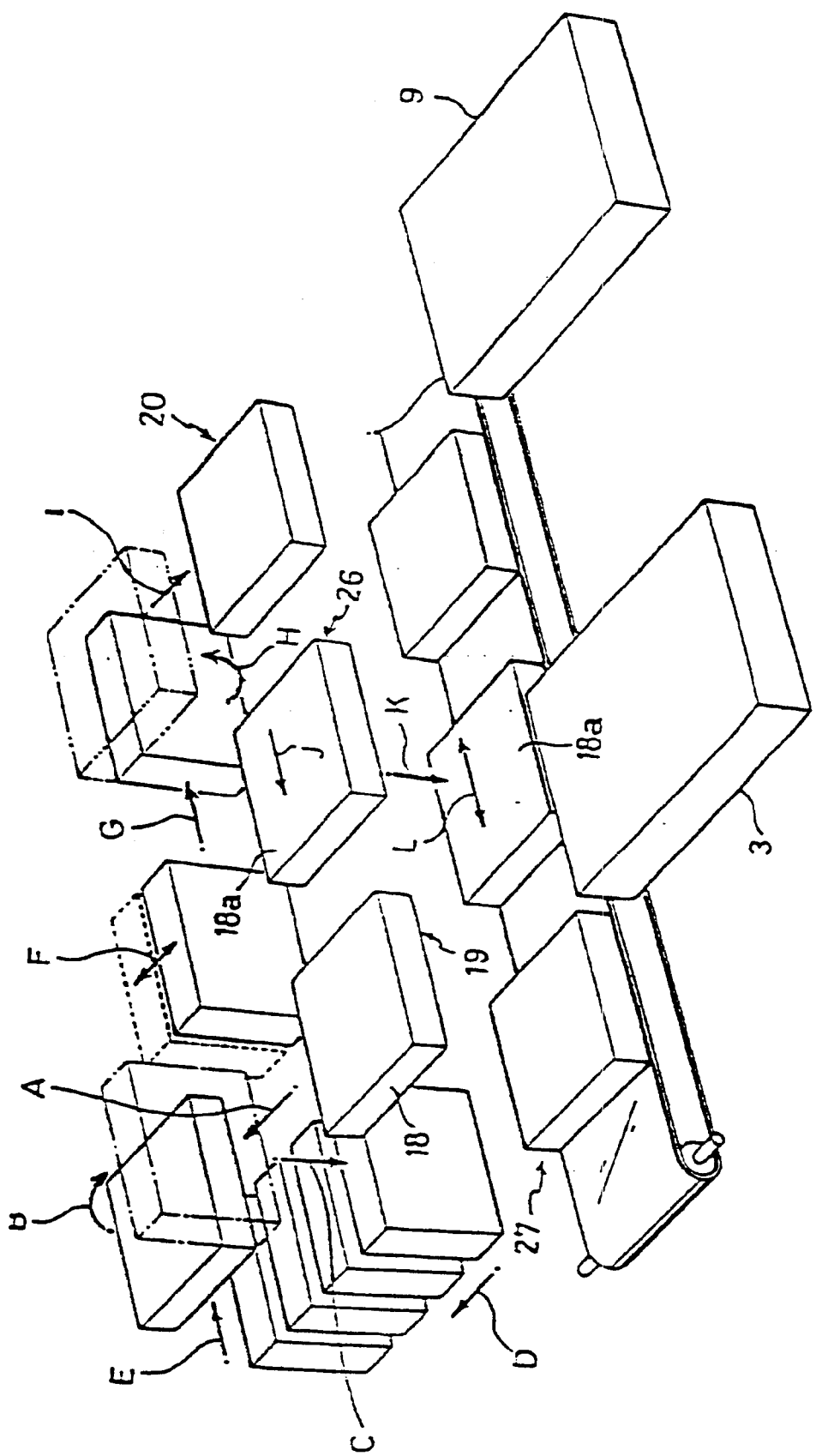
FIG. 6 is a schematic view showing a route along which the carrier travels in the module IC handler.
Figure 7:
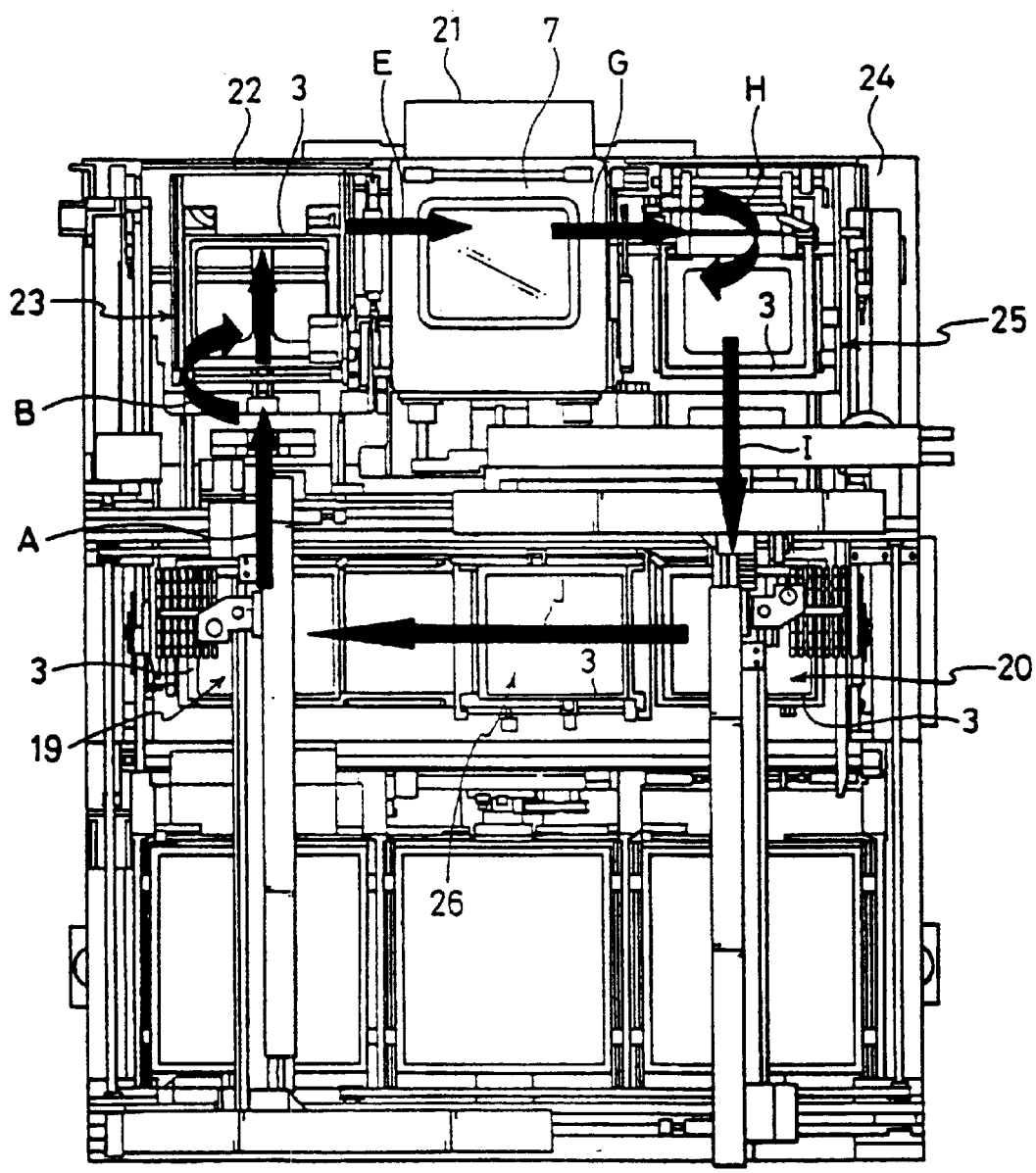
FIG. 7 is a plan view of the module IC handler to which the present invention is applied.
Figure 8:
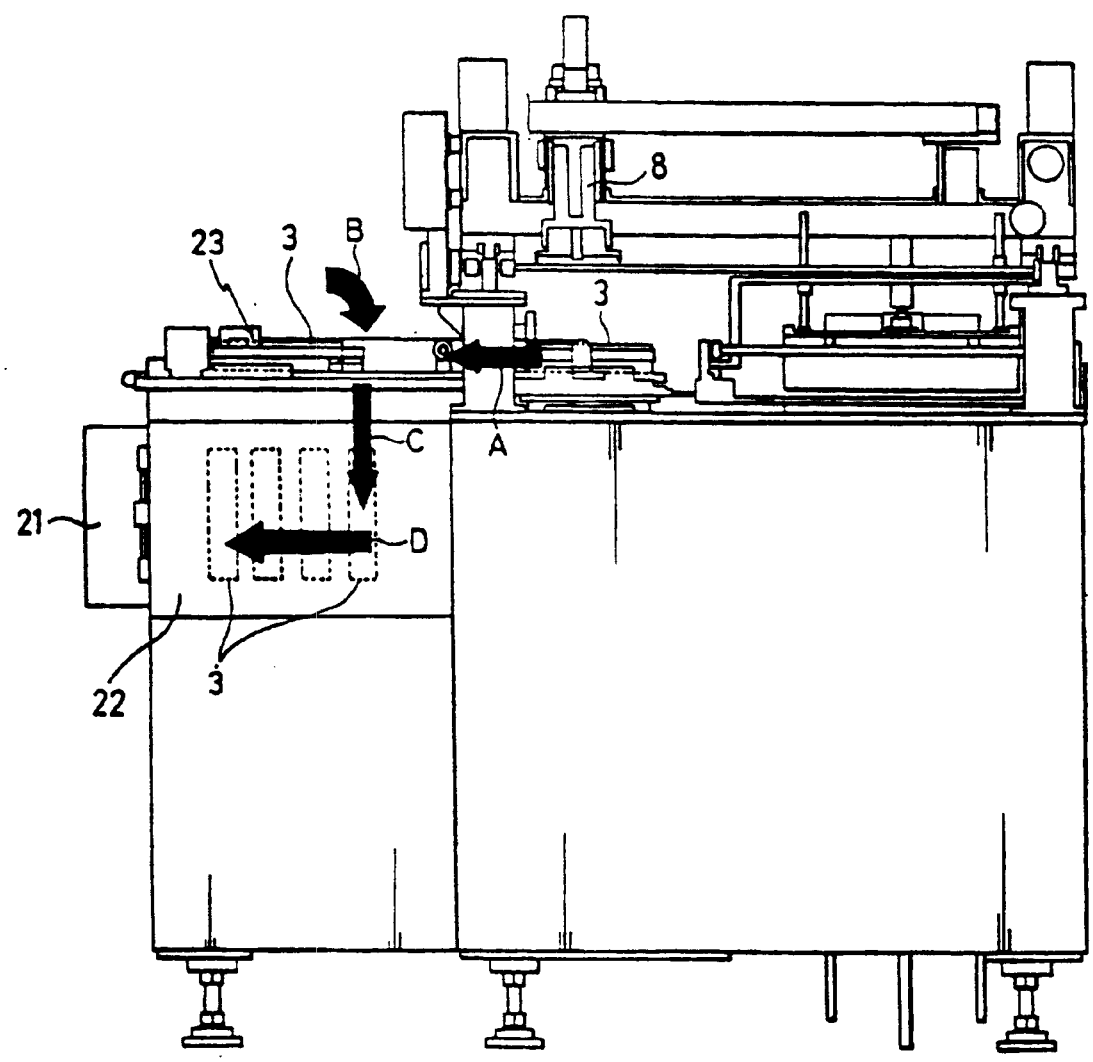
FIG. 8 is a side view of the handler shown in FIG. 7.

FIG. 6 is a schematic view showing a route along which the carrier travels in the module IC handler, FIG. 7 is a plan view of the module IC handler to which the present invention is applied, and FIG. 8 is a side view of the handler shown in FIG. 7.

The essential feature of the present invention is that the carrier in which the module ICs 1 are loaded at the loading position 19 is transferred between the processes, the tests are conducted, and the module ICs are classified at the unloading site 20 based upon the test results and the classified ICs are placed in the customer tray 9.

More specifically, the conventional loading side pick-up means 6 may be used for vertically depositing into the carrier 7 a plurality of module ICs contained in the tray 3. The carrier containing the module IC therein is transferred between the processes, during which the tests for the module ICs 1 are performed at the test site 7. Then, the module ICs that the tests are completed are held by the unloading side pick-up means 8 at the unloading position 20 and are classified based upon the test results. The classified module ICs are placed in the customer tray 9.

Such sequential procedures provides an advantage of the maximized operation rate of the apparatus in that the loading and unloading works of the module ICs are made possible by the conventional pick-up means 6, 8 at either the loading or unloading positions 19 or 20 during the transferring of the carrier 18 containing the module IC 1 therein between the processes.

According to the present invention, at the test site 7, a horizontal contact between the module IC and the test socket 12, as well as a vertical contact is possible.

However, in order to horizontally contact the module IC 1 at the test site 7, the carrier needs to be rotated by 90-degrees during the transferring between the processes of the carrier 18 in which the module ICs have been loaded.

As described above, with the carrier being rotated by 90-degrees, in the case of a vertical contact of the module IC 1, an advantage is provided in that a socket assembly 21 is easily removable from a rear surface of the test site 7.

In the case of a horizontal contact of the module IC 1, as in the conventionally performed manner, the socket assembly 21 to which the module IC is electrically contacted has to be installed on a bottom surface of the test site 7.

In case a different type of the module IC 1 is tested, the test socket needs to be removed from the bottom surface of the socket assembly so as to be replaced with a new socket assembly, but the troublesome replacing work of the socket assembly is introduced due to a narrow space below the test site.

However, as shown in FIG. 8, in the case of a vertical contact of the module IC 1, the socket assembly 21 is mounted at a rear surface of the test site 7. Thereby, a usable space further increases, which facilitates an exchanging work of the socket assembly.

Futhermore, the above-mentioned procedures makes it possible a test for the module IC, without using a heating chamber for performing a thermal resistance test.

However, in order to improve the reliability, when the heating chamber 22 is provided for the purpose of performing the thermal resistance test, the carrier 18 into which the module ICs 1 are loaded is rotated by 90-degrees by a rotating means. Then, the carrier is moved inside the heating chamber 22. In the heating chamber 22, the module ICs 1 should be heated at the preset temperature of 70 to 90-degrees Cels., and then tested.

FIGS. 6 to 8 illustrate in detail the procedures for testing the module ICs by loading the module ICs 1 to the carrier 18 positioned at the loading position 19 and heating the module ICs.

More specifically, the conventional loading side pick-up means 6 holds a plurality of module ICs 1 contained in the tray 3 and sequentially loads the same into the carrier 18 horizontally placed.

The deposited trays 3 containing the module ICs 1 as final products are sequentially elevated by one step using an elevator unit (not shown).

Such an operation is repeated. By the repetition, all module ICs 1 are loaded into the carrier, and thereafter, a transferring means horizontally moves the carrier 18 to the loading side rotator 23 in a direction indicated by an arrow A in FIG. 18.

After a horizontal transfer of the carrier 18 towards the loading side rotator 23, a locking lever (not shown) is rotated so that the carrier is not dropped from the loading side rotator. Accordingly, the carrier is locked.

After the carrier 18 is locked to the loading side rotator 23, a shutter on a lower part of the handler is opened, and the loading side rotator 23 is rotated by 90-degrees in a direction indicated by an arrow B so that the carrier 18 stands upright.

Under such a condition, the carrier 18 locked to the loading side rotator 23 vertically descends in a direction indicated by an arrow C. Then, the carrier is seated on a bottom surface of the heating chamber 22 maintaining a high temperature, followed by the release of the locking state of the carrier 18. Then, the loading side rotator ascends to an initial state thereof, and the opened shutter is closed again.

By such procedures, after one piece of the carrier 18 is provided inside of the heating chamber 22, the carrier provided is sequentially transferred by one step in a direction indicated by an arrow D, during which the carrier is heated at a temperature suitable for the tests.

After the carrier 18 provided inside the heating chamber 22 is moved by one step, in a same manner as described above, another carrier to which the module ICs 1 are loaded is provided inside the heating chamber 22. This makes it possible the transfer of the carrier within the heating chamber 22.

After the module IC is heated at a temperature conforming with the test conditions for the module ICs while the carrier 18 provided inside the heating chamber 22 is transferred by one step, the shutter located between the heating chamber 22 and the test site is opened. Thus, the carrier 18 positioned at a leading end in the heating chamber 22 by the transferring means is horizontally provided towards the test site 7 in a direction indicated by an arrow E.

With the module ICs heated at a temperature conforming with the test conditions being accommodated in the carrier 18, after the module ICs are provided inside the test site 7, the pusher (not shown) pushes the horizontally moved carrier 18 in a direction perpendicular to the transferring direction F. This operation allows the patterns of the module IC to be contacted to the terminals of the test socket 12. Then the tests for the module IC are conducted for a preset time period. The test results are reported to the central processing unit.

After the tests for the module ICs are conducted for the preset time period at the test site 7, the shutter located between the test site 7 and the unloading chamber 24 is opened and the carrier 18 is horizontally moved by the transferring means in a direction indicated by an arrow G, by which the carrier 18 is inserted inside the unloading side rotator 25.

After the carrier 18 is inserted inside the unloading side rotator 25, the locking lever 18 locks the carrier 18 so that the carrier 18 does not drop from the unloading side rotator during the rotation of the unloading side rotator 25. Thereafter, the carrier 18 return to its initial horizontal state by rotating the unloading side rotator in a direction indicated by an arrow H.

When the carrier 18 locked to the unloading side rotator 25 returns to a horizontal state, the locked state of the carrier is released and the carrier is moved to the unloading position 20 by the transferring means in a direction indicated by an arrow I. The unloading side pick-up means 8 is used to hold the module IC 1 from the carrier positioned at said unloading position and to unload the module IC in the customer tray 9 based upon the test results.

With the repeated operations by the unloading side pick-up means 8, all of the module ICs 1 in the carrier 18 are unloaded into the customer tray 9 based upon the test results. Thereafter, an empty carrier 18 is horizontally transferred to the loading position 19 by the transferring means in a direction indicated by an arrow J. Therefore, the repeated operations become possible.

The above description explains the sequential procedures that after the module ICs in the tray 3 being loaded into any one of the carriers 18, the module ICs are heated at high temperature in the heating chamber 22 and then tested, and based upon the test results, the module ICs are unloaded into the customer tray 9 at the unloading position 20. In case the module ICs to be tested are contained in the tray, it will be understood that while the carrier 18 is transferred between the processes, the continued tests for the module ICs can be conducted.

In the meantime, although the module IC is determined to be not good, the retest for said-module IC may be required. In this case, when the module ICs are classified into the customer tray 9 at the unloading position 20, the module ICs to be retested should be contained in a carrier or tray 18a for the retest which is positioned at a retest position 26.

According to the present invention, in order to perform the retest, the carrier 18a for the retest is positioned at the retest position 25 to be elevated or lowered in a direction indicated by an arrow K, the retest position being located between the loading position 19 and the unloading position 30. Into the carrier 18a positioned as described above are temporarily loaded the modules ICs 1 to be retested.

The carrier 18a for the retest is elevated or lowered by an elevator unit (not shown). The carrier 18a full of the module IC to be retested is horizontally transferred towards a stock space 27 in a direction indicated by an arrow L, the stock space 27 being provided immediately blow both the loading and unloading positions 19, 20. At there, the carrier stands by until all the module ICs 1 contained in the tray 3 are tested.

The carrier 18a for the retest which is positioned at the retest position 26 and receives therein the module ICs to be retested must not interfere with an empty carrier travelling towards the loading position 19 for receiving therein new module ICs to be tested, wherein the empty carrier results from the unloading at the unloading position 20. For this, the carrier 18a for the retest is temporarily lowered by the elevator in a direction indicated by an arrow K before the empty carrier is transferred up to the loading position 19. After the empty carrier is moved to the loading position 19, the carrier 18a is elevated again.

By the repeated operations, all the module ICs 1 deposited in the tray 3 are tested. If the completion of the tests is notified to a control unit, the retest procedures are performed for the module ICs contained in the carrier 18a for the retest.

Namely, after the carrier 18a having been located between the loading position 19 and the unloading position 20 is transferred to the loading position 20 by the transferring means, the retest is conducted in a same manner as described above.

Further, since the carriers 18a having been located in the stock space 27 immediately blow both the loading and unloading positions 19, 20 are sequentially transferred to the retest position 26 by the elevator, the module ICs contained in the carrier 18a for the retest is retested.

According to the foregoing, the present invention has the following advantages as compared with the conventional module IC handler, in that the tests are performed while the carrier containing the module ICs therein is transferred between the processes.

Firstly, the module ICs are loaded into the carrier using the pick-up means in the outside of the chamber, so that the module ICs loaded into the carrier are easily provided inside the chamber. The tests are performed after the module ICs being heated at a preset temperature. Thus, the reliability of the product is further improved by the tests done in such a manner.

Secondly, during the loading and unloading of the module ICs 1 into the carrier, the tests for the module ICs loaded in the carrier are performed at the test site. This contributes to the maximization of the operation rate of a high-cost test apparatus. Thus, within a given time period, lots of module ICs can be tested.

Finally, the socket assembly 21 can be installed on a rear surface of the chamber of the test site 7. Therefore, there is provided a convenient exchange work of the socket assembly in the case of different type of the module ICs to be tested.

What is claimed is:

1. A method for handling a plurality of module integrated circuits (ICs) in a test machine, comprising:

loading a plurality of module ICs into a carrier at a loading position;

transporting the carrier into a testing chamber, wherein the transporting includes rotating the carrier from a horizontal orientation to a vertical orientation;

testing the plurality of module ICs in the testing chamber while the module ICs are loaded in the carrier;

transporting the carrier to an unloading position; and unloading the module ICs from the carrier into trays based upon the results of the testing step.

2. The method of claim 1, wherein the loading step comprises placing the plurality of module ICs into the carrier while the carrier is in a horizontal orientation, and wherein the step of transporting the carrier into the testing chamber comprises lowering the carrier into the testing chamber.

3. The method of claim 1, wherein the step of transporting the carrier to the unloading position comprises rotating the carrier such that the carrier assumes a horizontal orientation.

4. The method of claim 1, wherein the testing step comprises testing the module ICs in a heated testing chamber.

5. The method of claim 4, wherein the transporting step results in the module ICs being heated to a predetermined temperature prior to the testing step being performed.

6. The method of claim 1, wherein the step of transporting the carrier into the testing chamber comprises:

locking the carrier into a loading side rotator;

moving the carrier into the testing chamber with the loading side rotator; and releasing the carrier from the loading side rotator.

7. The method of claim 6, wherein the moving step comprises:

rotating the carrier into a vertical orientation using the loading side rotator;

opening a loading shutter of the testing chamber; and lowering the carrier into the testing chamber using the loading side rotator.

8. The method of claim 1, wherein the step of transporting the carrier to the unloading position comprises:

locking the carrier into an unloading side rotator;

moving the carrier out of the testing chamber with the unloading side rotator; and releasing the carrier from the unloading side rotator.

9. The method of claim 8, wherein the step of moving the carrier out of the testing chamber comprises:

raising the carrier out of the testing chamber with the unloading side rotator; and rotating the carrier using the unloading side rotator such that the carrier assumes a horizontal orientation.

10. A method for handling a plurality of module integrated circuits (ICs) in a test machine, comprising:

loading a plurality of module ICs into a carrier at a loading position;

transporting the carrier into a testing chamber, wherein the transporting includes rotating the carrier from a horizontal orientation to a vertical orientation;

testing the plurality of module ICs in the testing chamber;

transporting the carrier to an unloading position; and unloading the module ICs from the carrier into a set of trays based on the results of the testing step, wherein the unloading step comprises unloading module ICs requiring re-testing into a re-test tray.

11. The method of claim 10, further comprising:

transporting the re-test tray to the loading position;

loading the module ICs in the re-test tray into the carrier;

transporting the carrier into the testing chamber;

re-testing the module ICs in the testing chamber;

transporting the carrier to the unloading position; and unloading the re-tested module ICs from the carrier into the trays based upon the results of the re-testing step.

12. The method of claim 11, wherein the step of transporting the re-test tray to the loading position is performed upon the earlier of the re-test tray becoming full, and all the module ICs being tested once.

13. The method of claim 10, wherein the testing step is performed such that all module ICs in the carrier are tested simultaneously while the carrier is in a vertical orientation.

14. The method of claim 10, wherein the step of transporting the carrier into the testing chamber comprises transporting the carrier into a heated testing chamber such that the module ICs are pre-heated prior to the testing step.

15. The method of claim 14, wherein the testing step is performed after the module ICs have been preheated to a predetermined test temperature.

16. The method of claim 10, wherein the step of transporting the carrier to an unloading position comprises rotating the carrier from a vertical orientation to a horizontal orientation.

17. The method of claim 10, wherein the loading, transporting, testing, transporting and unloading steps are repeated for a plurality of carriers, and further comprising the step of moving the re-test tray to the loading position when all the carriers have been through the cycle of steps one time.

* * * * *